United States Patent [19]

Vinal

[11] 3,997,909
[45] Dec. 14, 1976

[54] HIGH CARRIER VELOCITY MAGNETIC SENSOR

[75] Inventor: Albert Watson Vinal, Cary, N.C.

[73] Assignee: International Business Machines Corporation, Armonk, N.Y.

[22] Filed: May 14, 1975

[21] Appl. No.: 577,254

[52] U.S. Cl. ............................................. 357/27
[51] Int. Cl.² ..................................... H01L 27/22
[58] Field of Search ................................... 357/27

[56] References Cited
OTHER PUBLICATIONS

Physical Review – vol. 157 No. 3, 5-15-67 –
IBM Tech. Bul. – vol. 12, No. 1, 6-1969 – Gardner et al.

Primary Examiner—Edward J. Wojciechowicz
Attorney, Agent, or Firm—Edward H. Duffield

[57] ABSTRACT

A semi-conductive magnetic flux sensor is disclosed in which semi-conductive material having a resistance on the order of at least 500 ohms per square is placed in a lateral electric field of at least 500 volts per centimeter. A signal probe or contact located between the two lateral field contacts produces an output voltage when the sensor is subjected to magnetic fields having at least some component perpendicular to the plane of the three contacts. The device is highly sensitive and yields approximately one order of magnitude higher signal output than conventional Hall type semi-conductive magnetic sensors.

8 Claims, 9 Drawing Figures

HIGH CARRIER VELOCITY MAGNETIC SENSOR

FIELD OF THE INVENTION

This invention relates to semi-conductive devices and magnetic sensors in general and in particular, to the so-called Hall effect devices.

PRIOR ART

Hall type magnetic sensors are well-known in the art. These devices generally produce a sense voltage or Hall voltage output of, at best, on the order of 10 to 20 millivolts per kilogauss, as detailed in the IEEE Transactions on Electronic Devices, Volume ED-16, No. 1, January, 1969, pages 35–39. In the referenced article, a silicon MOS magnetic field transducer of high sensitivity, as that term is phrased by the authors, is set forth. The sensitivity of the device yields a mobility of the carriers on the order of 116 $cm^2$/volt-sec. The sensitivity of the output at the Hall probe points is on the order of 10 millivolts per kilogauss. It is stated in the article that approximately 150 $cm^2$/volt-sec. values for the Hall mobility might be theoretically obtained, at best. The lateral field impressed on the various devices cited in this article was approximately 180 volts per centimeter.

Another Hall type device is shown in U.S. Pat. No. 3,114,009 to M. Camras et al in which the T-shaped Hall device is shown. A similar configuration is utilized in the present invention, but the present invention is operated under much higher lateral field conditions and with a higher specified ohms per square to achieve a most unexpected result of carrier mobility and sensitivity one order of magnitude or more greater than the prior art.

Other patents showing Hall type devices are U.S. Pat. No. 3,715,522 to Tsukagoshi. U.S. Pat. No. 3,852,802 to Wolf et al shows an integrated circuit Hall effect device. Another type of integrated circuit Hall device is shown in the IBM Technical Disclosure Bulletin, Volume 17, No. 7, December, 1974, pages 1895 and 1896.

While a good deal of prior art exists in addition to the briefly noted references, these are believed to be fairly representative of the state of the prior art which has led to the present invention. It may be briefly stated that it is a well-known and observed effect in the prior art that as the lateral field voltage driving a FET type device is increased beyond a certain level, the mobility of the charge carriers decreases, although the causitive mechanism therefor is not fully understood. The mobility variations have been attributed either to the electric field lateral (parallel to the plane of the three contacts) to the channel in FET type embodiments, or to the electrical field normal (perpendicular to the plane of the three contacts) to the channel, or both. No satisfactory theoretical expression for the effect has been derived, but several empirical expressions have been proposed. It has been noted that at a certain electrical field lateral to the device, the mobility of the electrons begins to depart (and decrease) from its low energizing field mobility value of approximately 115$cm^2$/volt-sec. The electrical field at which this occurs for electrons is on the order of $10^4$ volts per centimeter. (See Cobbold, "Theory in Applications of Field Effect Transistors," Wiley Interscience, N. Y., 1970). Also see IEE Trans. on Electronic Devices, Vol. ED-19, pages 681–690, May 1972, and IEEE Transactions on Electron Devices, ED-14 Volume 37, January, 1967, and IEEE Transactions on Electron Devices, Volume ED-12, pages 248–254, May, 1965 in which it is clearly shown, although not fully understood, that the electron mobility (or the carrier mobility in Hall type devices) beings to drop at lateral fields on the order of $10^4$ volts per centimeter.

OBJECTS OF THE INVENTION

In light of the foregoing characteristic low degree of carrier mobility experienced in the best of the prior art characterized as "high mobility" devices, it is an object of the present invention to provide a very high mobility magnetic sensor which exhibits mobilities on the order of those experienced in bulk material, or about an order of magnitude greater than the best known prior art.

It is another object of this invention to provide an improved magnetic sensor device which exhibits high carrier mobility in a very high lateral electric field driving configuration.

Still a further object of the invention is to provide an improved Hall type element in which the sensor pickoff or probe point is formed as an integral part of the body of the sensitive material.

SUMMARY OF THE INVENTION

The foregoing and other objects of the invention are met by providing a slab of semi conductive material having a resistance on the order of at least 500 ohms per square. The material is subjected to a lateral electrical field of at least 5 times $10^2$ volts per centimeter for operation. Such a material being subjected to such a lateral field and having a signal voltage probe attached at one edge (intermediate the lateral field source terminations) and with the probe voltage referenced to some arbitrary base voltage, will exhibit signal changes due to magnetic field variations experienced by the sensor (normal to the body of semiconductive material) as defined by the plane in which the three contacts lie and will produce signal outputs on the order of one order of magnitude greater than the prior art, i.e., approximately 1 to 2 volts per kilogauss.

The foregoing and other objects, features and advantages of the invention will be apparent from the following more particular description of a preferred embodiment of the invention, as illustrated in the accompanying drawings.

SPECIFICATION

Figure 1:
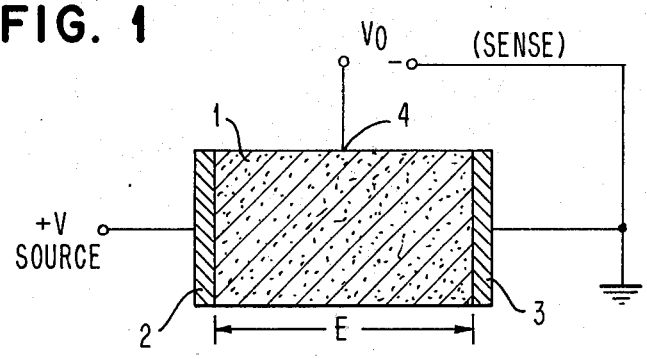
FIG. 1 illustrates in schematic form one preferred embodiment of the invention.

Turning now to FIG. 1, a schematic diagram of a preferred embodiment of the invention is shown. A body or slab of semiconductive material 1 having lateral field voltage contact terminals 2 and 3 is shown. A source of voltage is connected to contact 2 for example, and contact 3, for example, is connected to ground. An electrical field E therefore exists between terminals 2 and 3. Assuming that the semiconductive body 1 has uniform resistance along its length, the electric potential at any point midway along the body 1 can be easily derived as a proportion of the source voltage. A sense probe or point contact 4 is illustrated placed at some point intermediate the contacts 2 and 3. The sense contact or probe and a $V_o$ output voltage (or sense voltage) which is referenced to ground potential, is shown also.

It has quite unexpectedly been discovered that if the resistivity in ohms per square of the semi conductor body 1 is held within certain minimum ranges and if the electric field between the terminals 2 and 3 is maintained at a sufficiently high level, that the signal voltage output from probe 4 will be approximately one to two orders of magnitude greater than the best known previous Hall type devices. This indicates that carrier mobilities approaching that of the bulk mobility levels of the basic semi conductor material are being achieved. The theory of operation of the device as shown in any of the FIGS. 1-5 will presently be discussed together with a derivation of the formulas which describe the physics thereof.

Figure 7:
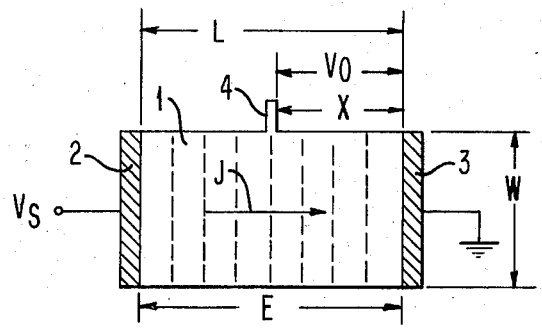
FIG. 7 illustrates in schematic form the theory of operation of the invention without a magnetic field applied.

The basic mode of operation of a "Hall device" appears to be that Lorentz deflection of charged carriers results in a Hall voltage. FIG. 7 illustrates in schematic form the basic structure of a device according to the present invention in which a source of voltage is connected across contacts 2 and 3 which are on opposite edges of a basic body of semiconductive material 1. A probe or contact point 4 is located intermediate the contacts 2 and 3 on body 1. The distance along the length L of body 1 at which the probe 4 is connected is measured as a distance X and the voltage $V_o$ between the probe point 4 and ground is the output voltage to be monitored. The width of body 1 is W and the electric field E exists between contacts 2 and 3 forming its length L. Assuming a uniform resistivity of body 1 between contacts 2 and 3, it will be clear that the voltage potential at any point X along the length L will be in proportion to its displacement from the source $V_s$. A current density J of charged carriers will be flowing in body 1 as shown in FIG. 7. In FIG. 7, various vertical dashed lines indicate the lines of equal potential along body 1. In this state, as depicted in FIG. 7, no magnetic field, B, has been impressed upon the semi conductor body. The sensor will respond to perpendicularly directed magnetic fields of either polarity passing into or out of the plane of FIG. 7.

Figure 8:
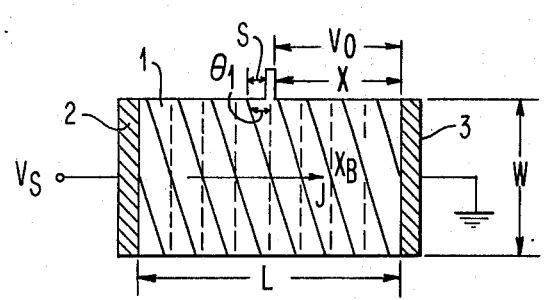
FIG. 8 illustrates the theory of operation of the invention with a magnetic field applied.

In FIG. 8, FIG. 7 is essentially reproduced but with a magnetic field B directed into the plane of the paper as shown by the cross X in the body portion of FIG. 8. The effect of this is to rotate the equal potential lines so that their ends are offset by a distance S from their original vertical location as shown in FIG. 7. This angle of rotation is expressed as $o_h$ or the Hall angle of rotation as shown in FIG. 8. Comparing FIGS. 7 and 8, it is quite apparent that rotation of the equal potential lines within the semi conducting slab has been depicted as being brought about by the introduction of a magnetic field with a direction normal to the surface of the slab 1. Equation 1 below gives an expression for the voltage $V_o$ measured between the probe contact 4 and ground, which is shown in FIGS. 7 and 8.

$$V_0 = V_s \left[ \frac{S}{L} + \frac{X}{L} \right] \quad \text{Equ. (1)}$$

Equation (1) above comes about from the basic assumption that the resistivity of body 1 is uniform along its length and that the voltage $V_o$ at any point is a function of distance along the length L (the X/L portion of equation (1) plus any signal component S which is brought about by the rotation of the equal potential lines as shown in FIG. 8 (the S/L portion of equation (1)). The term S in equation (1) is a function of the angular rotation of the equal potential lines shown in FIG. 8 as a result of applying a magnetic field of density B normal to the slab surface 1. Equation (2) below gives S in terms of the rotation angle $\theta_h$, the slab width W, the flux density B, and the carrier mobility $\mu$.

$$\text{Tangent of } (\theta_h) = \frac{2S}{W} = \mu B \quad \text{Equ. (2)}$$

Solving equation (2) for S and substituting this value for S into equation (1) yields equation (3) below.

$$V_0 = V_S \left( \frac{W}{L} \right) \frac{B\mu}{2} + \frac{V_{SX}}{L} \quad \text{Equ. (3)}$$

Figure 2:
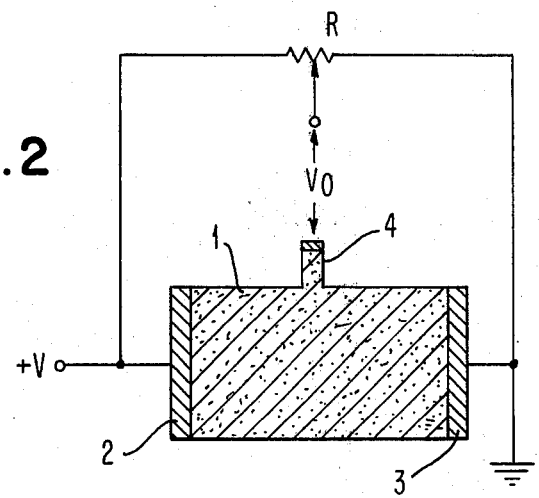
FIG. 2 illustrates another preferred embodiment of the invention.
Figure 3:
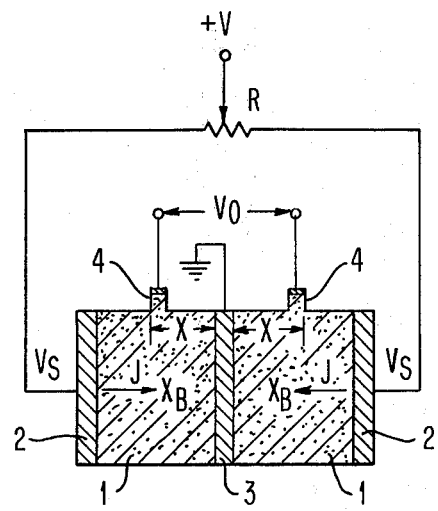
FIG. 3 illustrates a preferred method of connecting plural elements constructed according to the present invention to provide a balancing of the offset voltage which is produced.

Equation (3) is a fundamental expression for the potential which will be measured at the probe 4 positioned a distance X from the ground terminal 3 along the body 1 of the sensor. Equation (3) gives this potential as a function of the carrier mobility $\mu$, the magnetic flux density B, and the slab shape W/L, and the terminal voltage $V_S$. The output voltage $V_o$ contains two terms. The term $V_S \times X/L$ is a DC offset voltage which can be eliminated by referencing the probe potential voltage 4 to $V_0$ through a variable resistor such as is shown in FIG. 2. The preferred method of eliminating the offset voltage term is illustrated in the balanced twin T-shaped sensor configuration of FIG. 3 which will be described later. The output of the structure illustrated in FIG. 3 is given by equation (4) below.

$$V_0 = V_S \left( \frac{W}{L} \right) B\mu \quad \text{Equ. (4)}$$

The value of the mobility $\mu$ as described in the current invention corresponds closely to the bulk mobility value of the carrier material 1. For a given source voltage $V_S$, sufficient to exceed a critical lateral field value E to be described later, the sensitivity of the sensor can be modified by the choice of the W/L ratio. It can be shown that the signal to noise ratio for this type of magnetic sensor structure depends approximately on W/L to the three halves power.

Equivalent expressions for equation (4) above are as follows $$V_0 = W R_h JB \qquad \text{Equ. (5)}$$

$$V_0 = W \bar{V}_d B \qquad \text{Equ. (6)}$$

$$V_0 = \frac{R_h IB}{T} \qquad \text{Equ. (7)}$$

where T is the thickness of the slab 1, $R_h$ is equal to $\rho\mu$ which equals 1/NQ which is the Hall constant, $\bar{V}_d$ equals drift velocity of the charge carriers, B is the magnetic field in gauss, I is the source current, W is the width of the sensor.

Equation (7) above shows that the sensor output voltage or Hall voltage is inversely proportional to the thickness of the semi conductive slab 1. Making such a slab thin should therefore lead to a large Hall voltage per unit field B.

Some other expressions for the sensor output voltage at the probe contact point 4 are as follows.

$$V_0 = B\mu W \sqrt{P\Omega\square} \qquad \text{Equ. (8)}$$

$$V_0 = B\mu W \sqrt{P\Omega\square} \qquad \text{Equ. (9)}$$

Equation (6) above shows that the Hall voltage or output voltage is proportional to the velocity of the charge carriers and not to the number of the carriers. This is a subtle and important point which will be considered in some detail later. Equation (8) above shows that the output voltage is expressed in terms of applied current and the product of carrier mobility and the characteristic resistance in ohms per square of the semi condutive body in the active region.

Equation (4) above reflects that the output voltage may be put in terms of the applied voltage and the carrier mobility (together with the magnetic flux density and the aspect ratio of the device). Neither equation (8) nor equation (4) reflects the inherent limitations of the voltage or current values that can be applied to the semi conductive device. According to these equations, the output voltage per unit of applied field could be adjusted to any desired value by the application of sufficient current or voltage, as long as the heat generated in the semi conductive body could be removed. It is necessary to reflect the limits imposed by the power density developed in the active area of the semi conductive body. This is the purpose of equation (9).

Equation (9) is considered to be the most practical expression, since it defines the output or Hall voltage in terms of the carrier mobility $\mu$, the characteristic resistance of the device in ohms per square, the width of the device W, and the power density P dissipated in the conductive region of the body of the sensor.

A preferred embodiment of the invention as constructed using FET construction technology will be given below.

Several considerations must first be discussed, however. First is the fact that, as shown by equation (4), the output voltage is proportional to the mobility $\mu$ of the charge carriers. It is well known that as the lateral electrical field E applied to a semi conductive body increases, the mobility $\mu$ decreases. The reasons for this effect are not fully understood, but have been the subject of a good deal of speculation and investigation (see, for example, Gibbons, J. F., papers on "Carrier Drift Velocities in Silicon at High Electric Field Strengths," IEEE Transactions on Electron Devices, ED-14, Volume 37, January, 1967, or Merkel, G. and Joseph, B. and Cupcea, N. Z., "An Accurate Large Signal MOS Transistor Model for Use in Computer Aided Design," IEEE Transactions on Electron Devices, Volume ED-19, pages 681–690, May, 1972, and Cobbold, R. S. C., "Theory and Application of Field Effect Transistors," Wiley Interscience, pages 102–105, New York, 1970). Also see Caughey, B. M. and Thomas, R. E., "Carrier Mobilities in Silicon Empirically Related to Doping in Field," Proceedings of the IEEE letters, Volume 55, pages 2192 and 2193, December, 1967.

Taken in sum total, the teachings of the prior art are that greater Hall voltage outputs are obtained by increasing mobility and that increasing the electric field across the device will decrease mobility and thus will decrease the Hall output. In fact, with the use of silicon as a Hall type device for high sensitivity as shown in the aforementioned paper, IEEE Transactions on Electron Devices, Volume ED-16, No. 1, January, 1969, pages 35–39, the best Hall voltage outputs were obtained having mobility values on the order of 150 cm$^2$/volt-sec. for the basic substance used. It is well known that other substances such as gallium arsenide have much higher mobilities and which exhibit Hall mobilities comparable with the ordinary drift mobility for silicon and germainium as shown in, "The Physics of Semiconductors," by S. M. Sze, page 40 by John Wiley and Sons, 1969. As is also clear from Sze, page 45, the Hall mobility must be distinguished from the drift mobility of carriers.

Both the Hall mobility and the carrier or drift mobility are known to decrease with an increasing electrical field as noted previously and, therefore, the teaching of the art is directly away from the course taken in the present invention, i.e., one should not use a high electrical field since this will decrease mobility and will lead to lower Hall output. The difficulties with the prior art lies with the expressions which have heretofore been used for determining, on a theoretical basis, what the Hall output might be.

As is apparent from the derivations above, the significant criteria is carrier velocity, not mobility. However, merely achieving high carrier velocity by applying a high electric field would lead to disastrous consequences in power dissipation (as many experimentors have no doubt accidentally discovered!). The resistivity of the material, a function of the impurity level, and a consideration which also affects carrier and Hall mobilities as shown on page 40 of Sze, must also be taken into consideration. Equation (9) above does this.

The preferred embodiments of the invention, therefor, and all operative examples which exceed the level of performance known in the prior art, require certain minimum criteria. Firstly, the semiconductive material, the particular selection of which is not important, must be chosen so that resistance of approximately 500 ohms per square or greater is achieved. This is controlled by the thickness of the slab of semiconductive material and level of impurity concentrations as is well known in the art, and various methods for controlling the impurity concentration are equally well known. The other criteria that must be met is that the energizing electric field must be on the order of at least 500 volts per centimeter before the requisite carrier velocities will be achieved to provide the improved output.

The combination of criteria specifies a unique device in a unique set of operating circumstances which produces a result quite unknown in the prior art and in contradiction to the generally accepted view regarding Hall devices.

Figure 4:
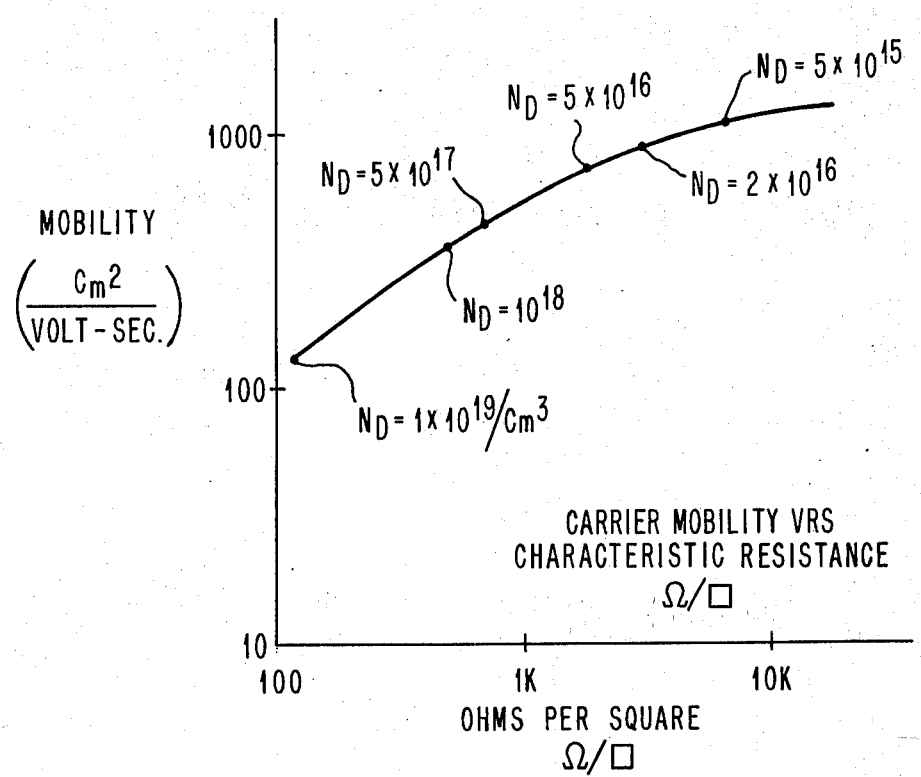
FIG. 4 is a chart showing the effect on carrier mobility versus the resistivity in ohms per square as provided by various dopant levels in a semiconductive body of material.

FIG. 4 illustrates a chart of carrier mobility plotted as a function of resistance in ohms per square. The concentration of impurity in terms of numbers of donor atoms per cubic centimeter is also plotted along the curve for N-type silicon. It is apparent that the lower the concentration of impurity atoms, the higher the resistance and the higher the carrier mobility.

Figure 6:
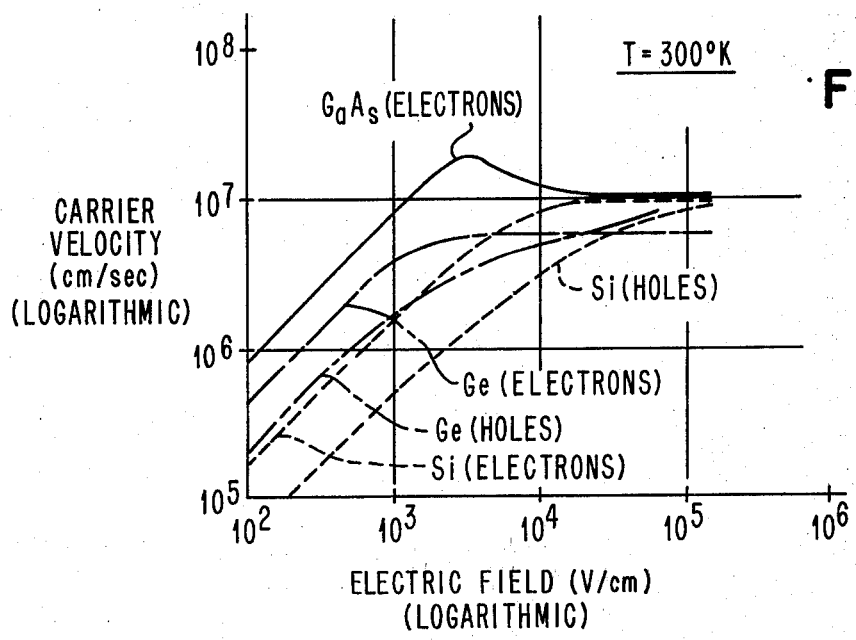
FIG. 6 illustrates the effect on carrier velocity produced by the electric field resulting from the potential applied across a semiconductive material.

Referring to equation (6), it is shown that the signal output voltage is proportional to drift velocity $\overline{V}_d$. FIG. 6 shows the effect of electric field on carrier velocity for various semiconductive materials and for both holes and electrons. It is evident that at a lateral field of $3 \times 10^4$ volts/cm, the carrier velocity approaches saturation and that the velocity of $10^7$ cm/sec. is virtually independent of the material and carrier type (holes and electrons). From equation (6), it is evident that a lateral field of $3 \times 10^4$ volts/cm is desirable and that the Hall type signal response will be virtually independent of the material used or whether the carriers are holes or electrons. To achieve this lateral field, it is essential to observe the specification criteria given for this invention relative to the resistance minimum of the conductive slab in ohms per square. It is apparent from the above discussion that it is immaterial what the semiconductive material composition is in deriving the large signal response, or which carrier type is used, provided that the combination of specified resistance in ohms per square and lateral electric field are simultaneously satisfied. It is important to know that both the field strength criteria for the electrical driving field and the resistivity in ohms per square criteria must be met in order to achieve an operative device which does not burn out with excessive power dissipation. Below these criteria levels, operation may be achieved but will not be of the improved type provided by the present invention.

Turning to FIG. 5, a preferred embodiment of the invention constructed using FET device techniques and ion implantation control of the impurity level and penetration depth will be described. The technique of ion implantation to control the impurity level and implant depth in semiconductor devices is well known as evidenced by U.S. Pat. Nos. 3,341,754, 3,434,894, and 3,653,977, in view of which no further description of the technique or process will be given here, it being apparent to one of skill in the art how the process is carried out. Also, since ion implantation is only one manner of controlling the impurity level and channel depth in semiconductor devices and many other techniques are well known, it is felt to be unnecessary to describe in detail how control of impurity levels and channel depth may be achieved. What is appropriate is that the device must be embodied in semiconductive material such as silicon, germanium or gallium arsenide with an impurity level controlled so that the number of donor atoms per cubic centimeter falls generally in the range below $10^{18}$ as illustrated in FIG. 4, so that an ohms per square of at least 500 may be achieved.

Figure 5A:
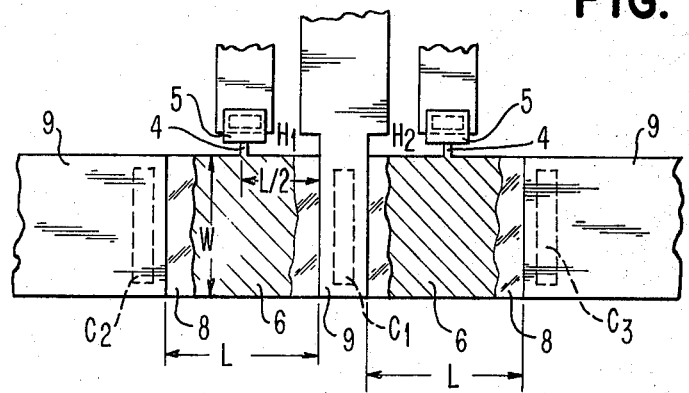
FIG. 5 illustrates a preferred embodiment of the invention as built using integrated circuit techniques in a form similar to that shown in FIG. 3.

In FIG. 5, a preferred form of the invention is shown constructed in a manner similar to the schematic diagram of FIG. 3. FIG. 5A shows a top or plan view of two ion implanted semiconductive areas which share a common and bisecting diffusion and connection strip which is one electrical contact C1 for the sensor. The other ends of the implanted areas are terminated by diffusion stripes in order to provide electrical contacts C2 and C3. The sensor probes 4 are positioned along one edge of the implant areas or channels so that they substantially bisect the lengths L of the implant areas themselves. The sensor probes illustrated are of the preferred form in which a narrow implant area projects from the main body of the semiconductive material so that when a diffusion contact is made, additional impurities will not be introduced into the main body of the semiconductive device. Other means of attaching a probe would be equally useful such as by direct physical contact with a microprobe, low temperature bonding, etc. The implant region including the small protrusion 4 which serves as a probe attachment point are created with a mask during the implantation of the ions so that the implant area geometry may be well controlled as well as the position and width of the attached contact point 4.

The cross-hatched area in the plan view of FIG. 5A is the implanted region 6 on a slab of semiconductive material 7, such as silicon, in which donor ions (such as phosphorous, for example) have been implanted by high energy bombardment. The techniques are well-known as noted by the aforementioned U.S. Patents on ion implantation and the process will not be discussed further. The contact areas C1, C2, C3 and contact pads 5 which attach to the probes 4 are all made in a typical masked diffusion process in which high numbers of carrier donors are introduced into limited regions of the semiconductive substrate material. Following this operation, a silicon dioxide layer 8 is grown or deposited across the entire surface of the semiconductive body with its implant areas, holes are etched through the silicon dioxide layer at appropriate spots for attaching electrical conductors, and then aluminum contact stripes are deposited over the silicon dioxide layer and through the various etched holes to make contacts with C2, C1, and C3 as well as the small probe portions 4.

Figure 5B:
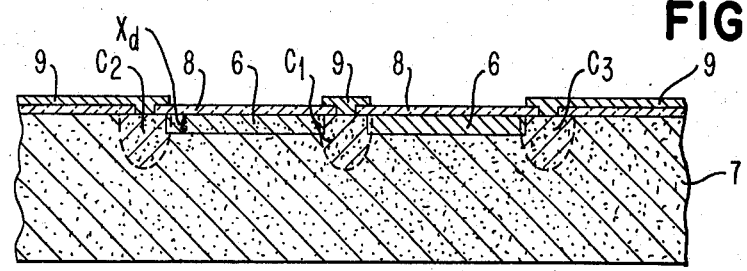

This is seen to better effect in FIG. 5B which is a cross-sectional view taken longitudinally through the device as shown in FIG. 5A. The implant areas 6 are implanted to a depth $X_d$ which is controlled by the electron volt energy of the ions which bombard the surface of the substrate silicon material 7. The substrate silicon material has an approximate concentration of acceptor atoms of about 5 times $10^{15}$. The diffusion areas C1, C2, C3, and the contact pads 5 have approximate donor concentrations of 2 times $10^{19}$ donors per cubic centimeter so that they are relatively high conductivity areas. A silicon dioxide layer 8 overlaying the implanted areas 6 and the contacts C1 through C3 and 5 as shown in cross-section with holes etched through at appropriate locations so that the aluminum contact stripes 9 may project through the holes and make physical contact with the various contact areas as shown.

The contact areas of the probes 4 should generally be as narrow as possible since the sensitivity of the device diminishes in proportion to the ratio of the contact width to the channel length L. The specifications of a typical preferred embodiment constructed according to these techniques would be as follows for a silicon substrate device:

Substrate impurity concentration — approximately $5 \times 10^{15}$ acceptor locations per cubic centimeter.

Ion implant material — phosphorous, as an electron donor.

Implant dosage rate - 150 kiloelectron volts implant energy controlled to give a density of doner atoms of approximately 2 times $10^{12}$ donors per square centimeter.

Implant depth - approximately 1800 Angstron units.

Implant resistivity in ohms per square - approximately 10 kilohms.

The results using such a device where the dimensions of the sensor areas for width and length and the dimensions of the probe given as follows are: for the sensor areas a width of approximately 1.45 mils, a length of approximately 1.15 mils. Contact probe 4, width approximately .1 mil, length approximately .1 mil. Voltage supply at contacts C2 and C3 approximately 10 volts. Output level - plus or minus 150 mil. volts at a driving field of plus or minus 750 oersteads supplied by a fixed magnet applied normal to the surface of the sensor. Output sensitivity - approximately 180 microvolts per oerstead. This is an equivalent output of approximately 180 millivolts per kilogauss, or on the order of 20 times the average output of a "high sensitivity" prior art Hall probe or sensor.

Several observations are in order. First, it is immaterial whether the donor ions or atoms contribute holes or electrons as is apparent from Sze noted above, page 59, which shows the carrier velocity in centimeters per second versus the electric field potential for silicon, for germanium, and for gallium arsenide, for both electrons and holes. While some differences exist at the relatively low field values, it is apparent that the carrier velocity approaches something on the order of 1 tims $10^7$ centimeters per second for both electrons and holes in all of these materials at electric field values in the range of $3 \times 10^4$ volts per centimeter. At lower levels of electric field strength, operation will still be achieved but the carrier velocities will be lower and the resulting sensitivity will be lower and the sensitivity will then become dependent on material and carrier type. Operation will nevertheless far exceed the prior art so long as the minimum electic field levels of at least 500 volts per centimeter and mimimum resistivity of at least 500 ohms per square are maintained. It should be noted that the electriic field produced in the above example where ten volts are applied across approximately a one mil sensor width is on the order of $10^4$ volts per centimeter so that the saturation carrier velocities are being achieved with the resultant high sensitivity. This is also the level at which the prior art teaches that mobility will begin to decrease with increasing field potential.

While the invention has been shown and described with reference to a particular embodiment thereof, it will be understood by those of skill in the art that other changes in form and detail may be therein without departing from the spirit and scope of the invention.

What is claimed is:
1. An improved magnetic flux sensor, comprising:
a body of semiconductive material having a resistance of at least 500 ohms per square;
a source of electrical voltage potential connected to separate contact points on said body, creating an electrical field therebetween of at least 500 volts per centimeter; and
an output contact located intermediate said voltage potential contact points on said body, said output providing a voltage output signal whenever said body is intersected by a magnetic flux field having at least some component of flux directed perpendicular to the plane in which said contact points lie.

2. Sensor apparatus as described in claim 1, wherein:
said body has a resistance in the range of 500 to 100,000 ohms per square; and
said electrical field has a strength in the range of from 500 to 100,000 volts per centimeter.

3. Apparatus as described in claim 1, wherein:
said body has a resistance in the range of 5,000 to 20,000 ohms per square; and
said electrical field has a strength in the range of from 3,000 to 30,000 volts per centimenter.

4. Apparatus as described in claim 1, wherein:
said body has a resistance of least 1,000 ohms per square; and
said electrical field has a strength of at least 1,500 volts per centimeter.

5. Apparatus as described in claim 1, wherein:
said semiconductive body has an impurity level of charged carrier donors or acceptors of less than $10^{18}$ per cubic centimeter.

6. Apparatus as described in claim 2, wherein:
said semiconductive body has an inpurity level of charged carrier donors or acceptors of less than $10^{18}$ per cubic centimeter.

7. Apparatus as described in claim 3, wherein:
said semiconductive body has an impurity level of charged carrier donors or acceptors of less than $10^{18}$ per cubic centimeter.

8. Apparatus as described in claim 4, wherein:
said semiconductive body has an impurity level of charged carrier donors or acceptors of less than $10^{18}$ per cubic centimeter.

* * * * *